United States Patent [19]

Beisswenger et al.

[11] Patent Number: 5,597,609

[45] Date of Patent: Jan. 28, 1997

[54] PROCESS AND APPARATUS FOR THE CONTINUOUS OR SEMI-CONTINUOUS COATING OF EYEGLASS LENSES

[75] Inventors: Siegfried Beisswenger, Alzenau; Michael Fliedner, Bruchköbel, both of Germany

[73] Assignee: Leybold Aktiengesellschaft, Hanau am Main, Germany

[21] Appl. No.: 401,379

[22] Filed: Mar. 9, 1995

[30] Foreign Application Priority Data

Mar. 9, 1994 [DE] Germany ............... 44 07 909.5

[51] Int. Cl.⁶ ................................................ B05D 5/06
[52] U.S. Cl. .................. 427/8; 427/162; 427/164; 427/255.7; 427/255; 427/419.2; 427/419.3; 427/385; 427/166; 118/697; 118/698; 118/705; 118/707; 118/712; 118/50; 118/719; 118/723 VE; 118/730; 204/192.26
[58] Field of Search ............... 427/8, 240, 166.66, 427/162, 255.7, 255, 419.2, 419.3; 118/697, 698, 705, 707, 712, 50, 719, 723 VE, 730; 204/192.26

[56] References Cited

U.S. PATENT DOCUMENTS

| | | | |
|---|---|---|---|
| 3,652,444 | 2/1972 | Lester et al. | 204/298 |
| 5,038,711 | 8/1991 | Dan | 118/715 |
| 5,138,974 | 8/1992 | Ciparisso | 118/731 |
| 5,340,454 | 8/1994 | Schaefer et al. | 204/192.12 |

FOREIGN PATENT DOCUMENTS

| | | |
|---|---|---|
| 0444618 | 2/1991 | European Pat. Off. |
| 3270728 | 12/1991 | Japan . |
| 9213114 | 8/1992 | WIPO . |

Primary Examiner—Janyce Bell
Attorney, Agent, or Firm—Felfe & Lynch

[57] ABSTRACT

Lenses are brought individually or in pairs on a transport device (12) to a continuous vacuum apparatus (1) equipped with a rotating substrate carrier (3). The eyeglass lenses (13) are introduced through a system of locks (15) into the continuous vacuum apparatus (1), where they are coated in at least one controllable coating station (5, 6, 7) with at least one transparent layer and then sent back to the transport device (12). The eyeglass lenses (13) are given codes (18), and the codes are read by a code reader (19). The coating parameters of the individual coating stations (5, 6, 7) and the drive of the substrate carrier (3) are controlled by the code reader (19).

9 Claims, 2 Drawing Sheets

PROCESS AND APPARATUS FOR THE CONTINUOUS OR SEMI-CONTINUOUS COATING OF EYEGLASS LENSES

BACKGROUND OF THE INVENTION

The invention pertains to a process for the coating of eyeglass lenses in a vacuum apparatus.

Eyeglass lenses are provided with one or more layers to make them antireflective and/or to give them certain reflecting colors, which may also be subject to changes of fashion. Eyeglass lenses of plastic are provided with scratch-resistant protective layers to prolong their life.

U.S. Pat. No. 5,138,974 discloses coating eyeglass lenses in batches by attaching a plurality of them to a dome-shaped substrate holder and by coating them by means of a vapor deposition process. In this process, a relatively large number of eyeglass lenses is produced, all of which are provided with the same coating materials. Because of the nonuniform way in which the vapor spreads out from the coating source, however, it is practically impossible to provide all of the eyeglass lenses of one batch with layers of the same thickness. Aside from this problem, batch-wise systems of this type cannot be integrated into the normal production sequence of modern lens production systems, in which eyeglass lenses are produced individually or in pairs and then subjected to further processing. Eyeglass lenses are usually produced "by prescription" in pairs with the same properties; and also in this respect the known batchwise systems are inflexible, since they are incapable of producing a succession of eyeglass lenses which differ from one another with respect to their radii of curvature and coating materials.

A further disadvantage of the known batch systems consists in that the eyeglass lenses must be loaded by hand onto the dome-shaped substrate holders. This hand loading brings with it the danger of damage. It is not possible in practice to automate this step.

SUMMARY OF THE INVENTION

The invention provides a coating process for eyeglass lenses which can also be integrated into the conventional production and finishing processes for coated eyeglass lenses and which makes it possible to provide eyeglass lenses individually or in pairs with coatings or coating systems precisely defined in advance.

The task is accomplished by bringing the eyeglass lenses up individually or in pairs on a transport device to a continuous vacuum apparatus with a rotating substrate carrier. The lenses are then introduced through a system of locks into the continuous vacuum apparatus, where they are coated in at least one controllable coating station with at least one transparent coating and then sent back through the lock system individually or in pairs to a transport device. Codes are assigned to the eyeglass lenses, individually or in pairs. The codes are read by a code reader, and the coating parameters of the coating station in question and the drive of the substrate carrier are then controlled by the code reader.

By means of the invention, the eyeglass lenses are put on an assembly line, so to speak, coated in the coating apparatus, and then set back down either on the same assembly line or on a different one. In the coating apparatus, each lens is given a single or multi-layer coating in the course of a static coating process. One or more eyeglass lenses can be present simultaneously in the coating apparatus. The coating apparatus can have one or more coating stations. The process according to the invention can be operated in cycles. With a cycle time of 60 seconds, for example, it is possible to coat 60 lenses or 60 pairs of lenses per hour. The process in question can be integrated easily into the production and finishing process for eyeglass lenses.

In the process according to the invention, the need for loading the coating system by hand is also eliminated.

Because the eyeglass lenses are assigned codes either individually or in pairs, because the codes are read by a code reader, and because the coating parameters of the various coating stations and the drive of the substrate carrier are controlled by the code reader, the coating process is automated. In particular, the coating properties can be changed as desired from substrate to substrate, so that it is possible to control the reflecting colors of an antireflective layer in accordance with the appropriate specifications. As a result, an extremely high level of flexibility is achieved in terms of the overall coating technology.

The codes can contain information on the diameter, work material, and curvature or diopters of the eyeglass lenses as well as on the reflective colors and the number of individual layers in the coating system.

It is also advantageous for the eyeglass lenses to be deposited individually or in pairs on a transport pallet and for the transport pallet to be provided with the codes. Transport pallets of this type can be adapted to carry eyeglass lenses of different dimensions, so that the coating apparatus itself does not have to be modified to process different lens diameters.

The invention also pertains to a vacuum apparatus for the coating of eyeglass lenses in a vacuum chamber with at least one controllable coating station. A transport device supplies eyeglass lenses, arranged individually or in pairs, to the vacuum chamber, which is equipped with a rotating substrate carrier. The lenses are introduced, individually or in pairs, into the vacuum chamber via a lock system and, after they have been coated, returned to a transport device. A code reader, installed along the transport route of the lenses, reads the codes which are assigned either individually or in pairs to the eyeglass lenses. The output signals of the code reader are sent to a control unit for the coating parameters of at least one coating station and for the drive of the substrate carrier.

It is especially advantageous for the control unit for the substrate carrier to be designed in such a way that the substrate carrier can be rotated at least temporarily in the reverse direction (retrograde), so that at least one of the coating stations can be passed through more than once.

Especially good coating qualities are achieved if at least one of the coating stations is designed as a sputtering device.

For the production of so-called protective coatings, for example, the coating rate can be increased in an especially advantageous manner if at least one of the coating stations is designed as a PCVD (plasma-controlled vapor deposition) coating source.

The transport device delivers the lenses continuously or semicontinuously to one end of the coating system. The loading and unloading device removes the most recently coated lens or pair of lenses from the lock system and sets it back down on the transport device, which can be designed in an especially simply manner as a conveyor belt.

Simultaneously, an uncoated lens is laid in the lock system. The substrate holder, which is designed as a rotating table, rotates through the individual coating stations, which are installed on a circular track corresponding to the transport route of the lenses. The substrates are transported from coating station to coating station and finally back to the lock system by means of the intermittent rotation of the substrate carrier.

The simplest coating system, which is used currently to render eyeglass lenses of mineral glass antireflective, consists of a single layer. Because currently about 50% of the antireflective lenses of mineral glass have only one such individual coating, it is sufficient in this case for the coating apparatus to be provided with only a single coating station.

A somewhat more complicated coating system consists of a double layer; that is, first a layer of high refractivity and then a layer of low refractivity are deposited on a mineral glass lens. For a coating system such as this, a coating apparatus with two coating stations is required. Insofar as such a coating system is deposited on plastic lenses, an additional adhesive layer is required; that is, to coat lenses of plastic material, at least three coating stations are required, the first being used to produce the adhesive layer, the second the high-refraction layer, and the third the low refraction layer.

With the object according to the invention, furthermore, it is also possible, by means of a coating apparatus with two or three coating stations, to deposit more complicated antireflective layers onto lenses of plastic or mineral glass. These more complicated, multi-layer systems usually consist of alternating layers of high- and low-refraction coating materials. In cases such as this, it is possible, by rotating the substrate carrier backwards and forwards between one coating station and another, to produce practically any desired type of multi-layer lumenizing coating.

The coding assigned to the eyeglass lenses, which can consist, for example, of a bar code, defines the prescribed properties of the finished lens. This bar code is detected by a code reader mounted along the transport route of the lenses before the first coating station, and the output signals of the code reader are used to control the coating parameters and to control the cycle time and rotational direction of the substrate carrier.

As a low-refraction material, it is possible to use $SiO_2$, for example; and $TiO_2$ is a suitable example of a high-refraction material.

The cycle time is determined by thickness of the thickest layer or by the slowest coating rate or by both factors. When a sputtering step is involved, the $TiO_2$ mentioned above is associated with a relatively slow sputtering rate. In such a case, it is especially advantageous for the coating station for $TiO_2$ to be doubled or tripled, so that the throughput of the overall system can be matched to the faster coating rate of the other coating stations. Similar considerations will apply to the production of thicker protective layers.

DETAILED DESCRIPTION OF THE PREFERRED EMBODIMENT

Figure 1:
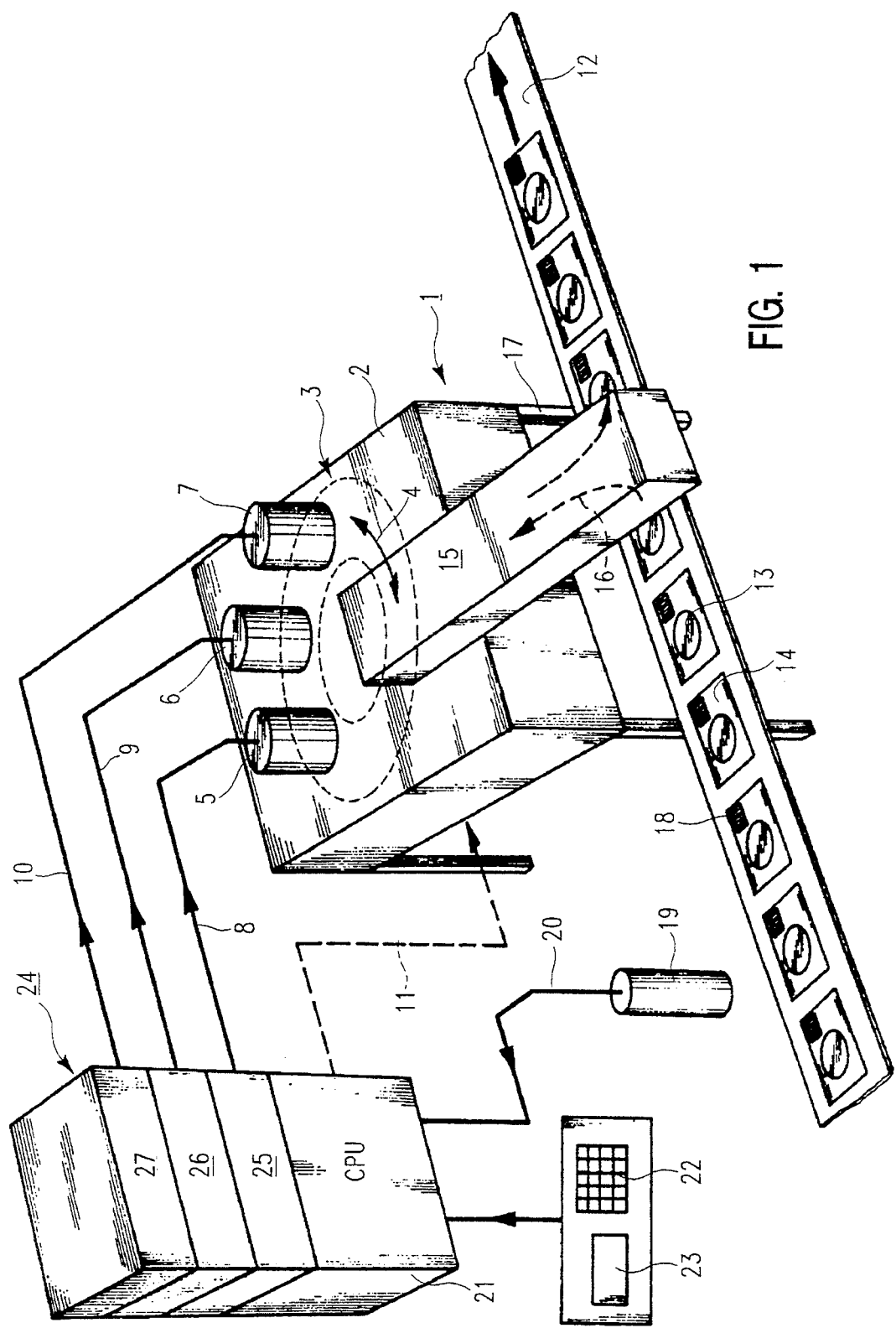
FIG. 1 shows a schematic diagram of a vacuum coating apparatus with three coating stations and a control unit in a perspective view.

FIG. 1 shows a vacuum apparatus 1, which consists of a box-shaped vacuum chamber 2 with a rotating substrate carrier 3, indicated by two concentric circles. This substrate carrier 3 can be rotated in either direction by a drive (not shown) as indicated by arrow 4.

Three coating stations 5, 6, 7, which, in the illustrated exemplary embodiment, are designed as sputtering devices, are installed in the cover of vacuum chamber 2, above the transport route defined by substrate carrier 3. Sputtering devices, which are in the present case designed advantageously as magnetron cathodes, have been known for a long time; they are supplied with electric power via three lines 8, 9, 10. Another line 11, shown in broken line, leads to the drive (not shown) for substrate carrier 3.

Parallel to a tangent to ring-shaped substrate carrier 3 there is a transport device 12, which is designed as a conveyor belt. An endless series of eyeglass lenses 13, which rest on transport pallets 14, are present on this transport device. Transport pallets 14 preferably have openings, the diameter of which is the same as the diameter of eyeglass lenses 13. In this way, if additional coating sources have been provided at the bottom of vacuum chamber 2 and if the substrate carrier is also provided with corresponding openings, lenses 13 can be coated simultaneously on both sides.

Figure 2:
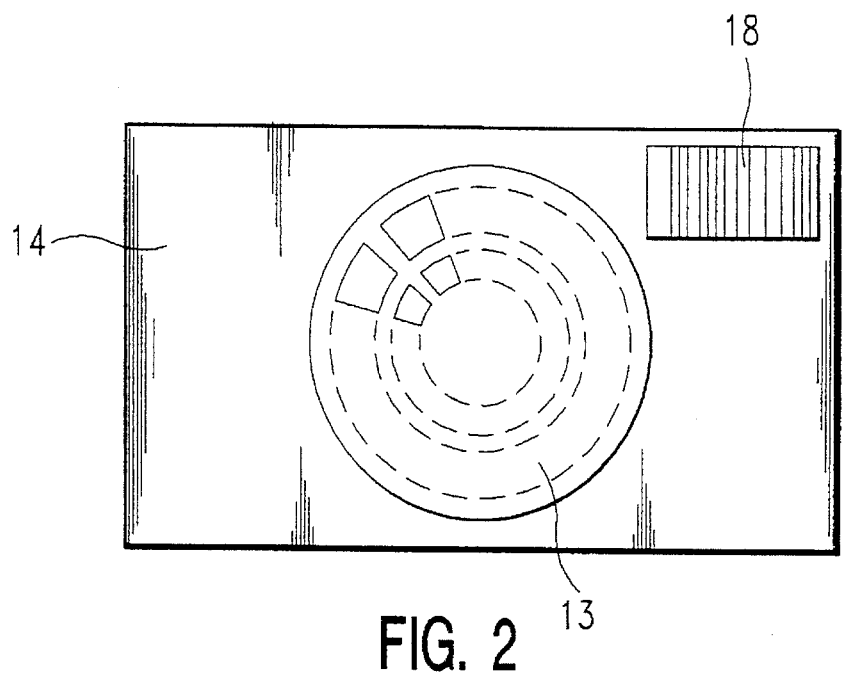
FIG. 2 shows a top view of a transport pallet with a lens and a bar code.
Figure 3:
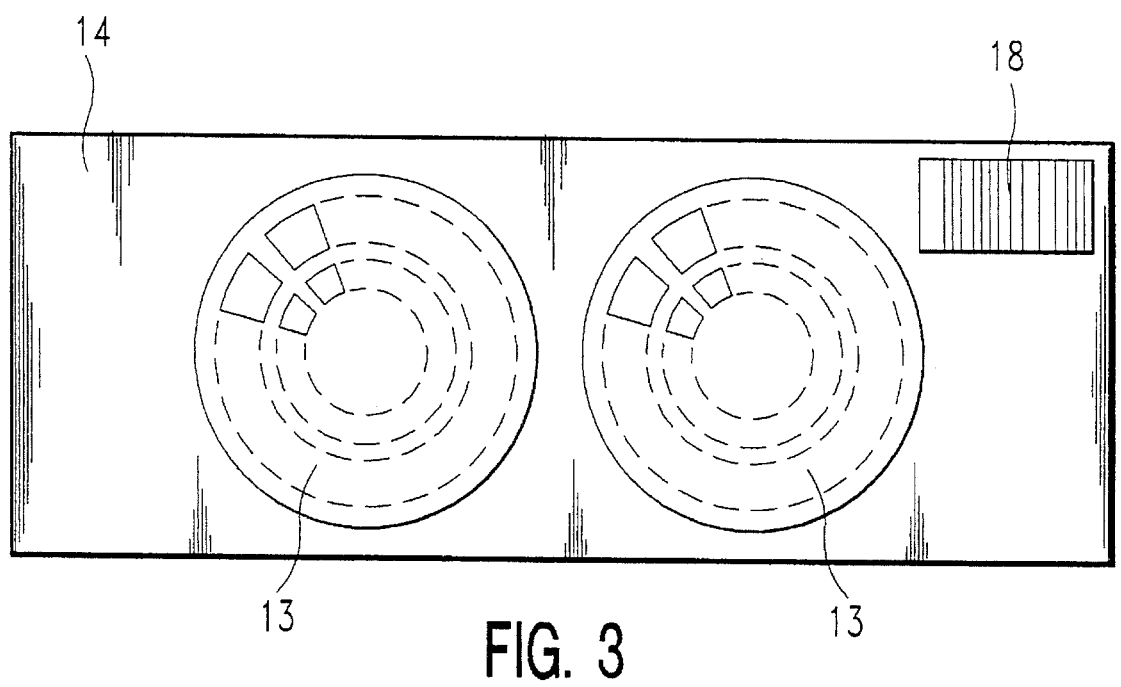
FIG. 3 shows a top view of a transport pallet with a pair of lenses and a bar code.

Between transport device 12 and vacuum chamber 2 there is a lock system 15 with a loading device 16 and an unloading device 17, both of which are indicated only symbolically by broken arrows. By means of loading device 16, a transport pallet 14 is picked up from transport device 12 and introduced through lock system 15 into vacuum chamber 2. After the coating has been applied at one or more of coating stations 5, 6, 7, the lenses enter lock system 15 again and are set down by loading device 17 on the transport device. Transport pallets 14 are therefore picked up and set down continuously, so that a virtually continuous series of lenses 13 is present on transport device 12. A transport pallet 14 of this type with a lens 13 and a code 18 as previously described are shown in FIG. 2. A transport pallet 14 with a pair of lenses is shown in FIG. 3.

Transport device 12 can also consist of two adjoining conveyor belts, which operate in the same direction, namely, tangentially to the substrate carrier 3, in the area of lock system 15, although this is not shown specifically in FIG. 1. The coated lenses would thus be loaded onto the second conveyor belt.

Along the transport route of lenses 13 predefined by transport device 12, a code reader 19 is installed before vacuum chamber 1 to read code 18. The output signal of code reader 19 is sent over line 20 to a central processor 21, which can be programmed by means of an input keyboard 22. Nominal values and measurement values can be called up and read from a display unit 23. Central processor 21 is part of a control unit 24, which includes three individually adjustable power supplies 25, 26, 27 for coating stations 5, 6, 7. The way in which coating stations of this type are controlled, however, belongs to the state of the art, and there is therefore no need for further discussion of it here. The drive (not shown) of substrate carrier 3, that is, the cycling frequency and the rotational direction of substrate carrier 3, is also controlled by central processor 21 via line 11. Insofar as gas feeds to the individual coating stations must be controlled in an open-loop or closed-loop manner, this is also accomplished by central processor 21 via appropriate gas lines and control valves (not shown).

As can be seen especially clearly from FIG. 1, the coating process is carried out according to the "just-in-time" principle, that is, at the rate at which the overall lens production and finishing system operates. These production systems include, for example, stations for the grinding and polishing of the lenses before they are coated. Because there is no longer any need to load the lenses onto the conventional dome-like substrate holders by hand, there is also no longer any danger of the lenses becoming dirty or scratched.

We claim:

1. Process for the coating of eyeglass lenses, comprising providing a readable code containing coating parameters information associated with each of a plurality of eyeglass lenses, transporting said eyeglass lenses in tandem to a vacuum coating apparatus, reading the code associated with each eyeglass lens as it is transported, transferring each eyeglass lens to a rotatable substrate carrier in said vacuum coating apparatus via a lock, moving said lenses through at least one coating station on a circular path defined by said substrate carrier, and coating each lens at each coating station according to coating parameters determined by the code read for said each substrate.

2. Process as in claim 1 wherein said lenses are moved through a plurality of coating stations, said substrate carrier being rotated in retrograde so that a lens moves through at least one said station more than once.

3. Process as in claim 1 wherein said eyeglass lenses are transported by means of a transport device on which said codes are provided.

4. Process as in claim 1 wherein at least one of said eyeglass lenses is arranged with an additional eyeglass lens to form a pair of eyeglass lenses, each pair of eyeglass lenses being associated with a readable code and passing through said at least one coating station as a unit.

5. Apparatus for coating of eyeglass lenses comprising at least one coating station, a vacuum chamber having therein a rotatable substrate carrier which moves through said at least one coating station, transport means for moving eyeglass lenses in tandem to said vacuum chamber, means for associating a readable code containing coating parameters information with each eyeglass lens, reading means for reading each said code and providing an output signal corresponding to each lens, transfer means for transferring each said lens from said transport means to said substrate carrier via a lock, control means for determining coating parameters at each said coating station and controlling movement of said substrate holder in response to said output signals.

6. Apparatus as in claim 5 wherein said control means can rotate said substrate carrier in retrograde.

7. Apparatus as in claim 5 wherein said means for associating a readable code comprises codes provided on said transport means.

8. Apparatus as in claim 5 wherein said transport means moves said substrates in a direction which is parallel to a tangent to the substrate carrier.

9. Apparatus for coating of eyeglass lenses as in claim 5, wherein at least one of said eyeglass lenses is arranged with an additional eyeglass lens to form a pair of eyeglass lenses, each pair of eyeglass lenses being associated with a readable code and passing through said at least one coating station as a unit.

* * * * *